US012308725B2

(12) United States Patent
Sturm et al.

(10) Patent No.: US 12,308,725 B2
(45) Date of Patent: May 20, 2025

(54) MODULAR CIRCUIT BOARD ARRANGEMENT AND METHOD FOR ASSEMBLING A CIRCUIT BOARD ARRANGEMENT

(71) Applicant: ebm-papst Mulfingen GmbH & Co. KG, Mulfingen (DE)

(72) Inventors: Michael Sturm, Bad Mergentheim-Rot (DE); Steffen Hanselmann, Ilshofen (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 348 days.

(21) Appl. No.: 18/087,884

(22) Filed: Dec. 23, 2022

(65) Prior Publication Data
US 2023/0208249 A1    Jun. 29, 2023

(30) Foreign Application Priority Data

Dec. 27, 2021    (DE) .................... 10 2021 006 359.7

(51) Int. Cl.
*H02K 5/22*    (2006.01)
*H01R 12/52*    (2011.01)

(52) U.S. Cl.
CPC ........... *H02K 5/225* (2013.01); *H01R 12/523* (2013.01); *H01R 2201/10* (2013.01)

(58) Field of Classification Search
CPC ............. H05K 1/144; H05K 2201/042; H05K 2201/09027; H05K 3/366; H05K 3/368;
(Continued)

(56) References Cited

U.S. PATENT DOCUMENTS

| 4,200,900 A | * | 4/1980 | McGeorge | ............. H05K 1/141 |
| | | | | 361/791 |
| 4,297,769 A | * | 11/1981 | Coules | ................... H05K 1/144 |
| | | | | 174/138 D |
| 4,444,318 A | * | 4/1984 | Alexander | ............. F16B 5/065 |
| | | | | 211/41.17 |

FOREIGN PATENT DOCUMENTS

| DE | 102011087033 A1 | 8/2012 |
| DE | 102012223940 A1 | 6/2014 |

(Continued)

OTHER PUBLICATIONS

German Search Report dated Sep. 14, 2022 in corresponding German Application No. 10 2021 006 359.7.

(Continued)

*Primary Examiner* — Naishadh N Desai
(74) *Attorney, Agent, or Firm* — Harness, Dickey & Pierce, P.L.C.

(57) ABSTRACT

A circuit board arrangement (100) for a motor controller in a motor housing (50) has at least one first populated circuit board (LP1) and one second populated circuit board (LP2). Contact elements (20) are plugged together in the plug-in direction(S) in order to produce a detachable electrical connection with the first circuit board (LP1). An alignment and guidance device (LP3) protrudes from the first circuit board (LP1) in the plug-in direction(S) toward the second circuit board (LP2). In the assembled state, the contact elements (20) are completely in the plugged-in state with mating contacts (10) of the first circuit board (LP1). An end-side portion (30), of the device (LP3), protrudes through a gap (21) in the second circuit board. The contact elements (20) protrude from or out of the second circuit board (20) in different lengths.

15 Claims, 5 Drawing Sheets

(58) Field of Classification Search
CPC .... H05K 7/1417; H05K 7/1432; H02K 5/225; H01R 12/523; H01R 2201/10
See application file for complete search history.

(56) References Cited

FOREIGN PATENT DOCUMENTS

| | | |
|---|---|---|
| DE | 102020215561 A1 | 6/2022 |
| EP | 1748347 A2 | 1/2007 |
| WO | WO-2017/093457 A1 | 6/2017 |

OTHER PUBLICATIONS

European Seach Report dated May 16, 2023 in corresponding European Application No. 22211713.

* cited by examiner

MODULAR CIRCUIT BOARD ARRANGEMENT AND METHOD FOR ASSEMBLING A CIRCUIT BOARD ARRANGEMENT

CROSS-REFERENCE TO RELATED APPLICATION

This application claims the benefit and priority of German Application No. 10 2021 006 359.7 filed Dec. 27, 2021. The entire disclosure of the above application is incorporated herein by reference.

FIELD

The disclosure relates to a modular circuit board arrangement composed of two or more circuit boards and to a method of assembling such a circuit board.

BACKGROUND

Circuit board connectors are used primarily to establish electrically conductive connections between two circuit boards. This is in order to achieve a modular construction of various circuit boards, particularly printed circuit boards, that is uncomplicated to manufacture. In some cases, it is also desirable for a modular combination of different circuit boards and, at the same time, produce electrically conductive connections between the circuit boards by a circuit board connector as well as a mechanical coupling between them.

Printed publication DE 10 2012 102 055 A1 discloses an example of an electrically conductive connection as well as a mechanical coupling between two circuit boards. A connecting element is provided that has a bridge portion which, when mounted on two circuit boards, extends over the end regions of the two circuit boards. It also has press-in zones, with one of the press-in zones pressed into a respective borehole in the circuit board. The boreholes in the circuit boards are electrically conductive on their inner lateral surfaces. This enables both an electrical contact and a mechanical coupling to be achieved between the boreholes of the two circuit boards.

In addition, a large number of other solutions are known in the prior art, each of which has application-specific features. In this respect, they cannot be readily and meaningfully transferred to another application. The lack of or limited installation space is often a limiting factor.

For motor controllers that are integrated into motor housings, there is only one space available that is specific to the respective motor. Thus, the space must be used optimally, and technical aspects, such as heat dissipation during assembly, must also be taken into account.

Overall, a need exists for a control unit, particularly a motor control unit, with a construction that is simple and inexpensive to manufacture for a given housing or housing volume and, if possible, offers modularity. The design should be as space-saving as possible and ensure the simplest possible assembly process.

SUMMARY

It is therefore an object of the present disclosure to provide a circuit board arrangement, for a motor control unit, that has a space-saving design and is inexpensive to assemble. The assembly should be reliable and not damage the electrical contacts.

Another challenge is posed by the electrical connecting elements. These contacts connect the circuit boards of a circuit board arrangement. In addition to the non-detachable electrical connections, such as the press-in contacts that produce a cold weld in the contact zone upon being pressed in, those skilled in the art are also familiar with detachable connection techniques that can be implemented using typical plug-and-socket contacts. Normally, pin contacts interact with resilient socket contacts. In the case of multi-pole or high-pole contact arrangements, the plugging and unplugging forces, when the mating partners are plugged in and unplugged, add up. This results in the regular occurrence of undesirable high total plugging forces. In addition to the individual insertion force of a pair of contacts, caused by the shape and geometry of the contacts and their contact material, the tolerance position of the contacts relative to one another also determines the insertion and withdrawal forces in multi-pole or multi-pole contact arrangements. These are partly reduced through floating mounting of the contacts, but such floating mounting is not always desired and is also technically more complex to produce.

Another problem that arises is that an assembler expects a higher insertion force when plugging together the circuit boards with multiple or multi-pole electrical connecting contacts. Therefore, the assembler cannot easily use the insertion force to detect whether a contact was damaged or bent during plugging. Known solutions make use, for example, of a joining device with a lever press on a specially designed assembly table. In addition to high costs, this also entail the risk of undetected contact damage during lever pressing when assembling the circuit boards.

It is therefore another object of the present disclosure to improve and facilitate the assembly of such circuit board arrangements and to avoid damage caused by assembly errors.

A basic idea of the present disclosure relates to the utilization of the installation space in the motor housing through special nesting of the circuit boards, as well as the creation of electrical contacts of different lengths. Thus, these can be used to engage sequentially with the respectively corresponding socket contact one after the other, in offset fashion relative to one another as viewed in the plug-in direction, as a function of their individual contact length. Also, this provides an alignment and guidance device to ensure pre-centering of the contacts and guidance during the plugging-together of the circuit boards.

According to the disclosure, a circuit board arrangement forms a motor controller in a motor housing including at least one first populated circuit board and one second populated circuit board. The second populated circuit board is embodied with a plurality of contact elements that are designed to be plugged together in the plug-in direction of the contacts. This produces a detachable electrical connection with corresponding mating contacts of the first circuit board. A plate-shaped alignment and guidance device, which is preferably also a circuit board, protrudes from the first circuit board in the plug-in direction towards the second circuit board. In the assembled state, the contact elements of the second circuit board are completely in the plugged-in state with the mating contacts of the first circuit board. The device protrudes with an end-side portion through a gap in the second circuit board, with the contact elements protruding from or out of the second circuit board in different lengths.

A populated circuit board is to be understood as a circuit board that is fitted on at least one component side with the electrical and electronic components, particularly passive and active components, required for its function.

In the case of the application, a provision is preferably made that the first circuit board is instantiated as a superordinate main circuit board for the motor controller. It is also preferred that the second circuit board is a throttle circuit board. Likewise, it is preferred if the third circuit board, which protrudes from and is electrically and mechanically connected to the first circuit board, is a motor controller or controller board.

In principle, however, circuit boards with other functions can also be connected in the manner according to the disclosure. This nested arrangement makes optimal use of space, while at the same time a circuit board acts as a guidance and alignment device in order to accomplish assembly and enable alignment of the contacts.

By virtue of the different contact lengths, the total mating force is reduced. This is due to the forces acting successively, one after the other, so to speak, as soon as the trailing contact comes into engagement with its mating contact. To achieve this, the following configuration is preferred. In the case of the n contacts, where n>2, which protrude from the second circuit board in different lengths, the differences in length between the contacts are selected such that those contacts with a length between the length of the shortest and longest contacts each differ by an equidistant difference in length$\Delta$ L. Thus, when they are plugged together, the n contacts come into engagement successively one after the other. In other words, a first contact has the length L, a second contact has the length L+$\Delta$ L, a third contact the length L+$2^x\Delta$L, etc.

In an advantageous embodiment of the disclosure, the plate-shaped alignment and guidance device is also a circuit board, particularly a populated circuit board. The end-side portion of this circuit board is advantageously unpopulated. Depending on the design and width of the gap, however, this is not absolutely necessary. The side edges of the alignment and guidance device, or of this standing circuit board, interact with the gap in the second circuit board. The guidance takes place in the edge region, so to speak, making it possible in principle for the area of the third circuit board to be well utilized.

In a preferred embodiment of the disclosure, the gap width B of the gap in the second circuit board is defined such that the end-side portion of the alignment and guidance device, or of the third circuit board, is aligned and guided when the first and second circuit boards are plugged together. In particular, the width is defined such that the board thickness of the circuit board in the region of the end-side portion is only slightly smaller than the gap width B. The remaining clearance can be set as desired by suitably matching the gap size to the board thickness.

In another preferred embodiment of the disclosure, the gap width B is as described above only in the edge region and is selected to be larger than, particularly 1.5 to 2.5 times as large as the gap in the guide region at the gap ends in a region between the two gap ends, as viewed in the longitudinal direction of the gap. This enables plugging-together to be simplified, since only smaller active portions interact. Thus, jamming and tilting is prevented particularly when the guide clearance is selected to be small. Another advantage is that the third circuit board can also be fit with components that are able to then pass through the wider gap region when they are plugged together.

It is also advantageous if the opposite side edges of the alignment and guidance device, or of the third circuit board, do not run parallel to one another in the region of the end-side portion. Preferably, they run toward one another as an insertion bevel at an oblique angle to the plug-in direction. These insertion bevels further facilitate assembly, thereby simplifying the threading of the third circuit board into the gap in the second circuit board. The geometries of the side edges are subsequently selected, particularly, to run in parallel, so that the parallel side edges in the gap are each guided laterally at the opposite ends of the gap. Guidance is thus provided both transverse to and in the longitudinal direction of the gap. Thus, a desired alignment of the circuit boards and hence of the contacts overall is achieved.

It is also advantageous if the contacts are in the form of blade contacts or flat contacts. Each contact has two flat contact tongues arranged at the ends which, when the first and second circuit boards (LP1, LP2) are plugged together, respectively dip into a socket contact provided on each of the first and second circuit boards and contact the same electrically. It is also preferred if a contact carrier is arranged around the contacts that, preferably, has a locking member for mechanical attachment to one of the two circuit boards.

In the event that the contacts are arranged in contact rows of three or more contacts, for example, a common contact carrier is advantageously used for these contacts.

One preferred arrangement of the circuit boards is as follows. When assembled, the first and second circuit boards lie in planes parallel to one another. The third circuit board, or the plate-shaped alignment and guidance device, is arranged in a perpendicular plane. Thus, it can be aptly characterized as an upright alignment.

Another aspect of the present disclosure relates to an electronics housing for an electric motor with a circuit board arrangement, according to the disclosure as described above, in the housing between a housing pot and a housing cover designed as protection against contact.

In addition to the abovementioned devices, another aspect of the present disclosure relates to the method for assembling such a circuit board arrangement comprises the following steps:
  a. manual (i.e., toolless) insertion of the end-side portion of the plate-shaped alignment and guidance device protruding from and connected to the first circuit board into the gap in the second circuit board and aligning the contacts of the second circuit board with the mating contacts of the first circuit board; and
  b. manual (i.e., toolless) successive plugging-together of the contacts with the mating contacts until all of the contacts are fully inserted and the circuit boards are connected.

Further areas of applicability will become apparent from the description provided herein. The description and specific examples in this summary are intended for purposes of illustration only and are not intended to limit the scope of the present disclosure.

DRAWINGS

Other advantageous refinements of the disclosure are characterized in the subclaims and/or depicted in greater detail below together with the description of the preferred embodiment of the disclosure with reference to the figures. In the drawings:

DETAILED DESCRIPTION

The disclosure will be explained in greater detail below with reference to the figures, with same reference symbols in the figures indicating same functional and/or structural features.

Figure 1:
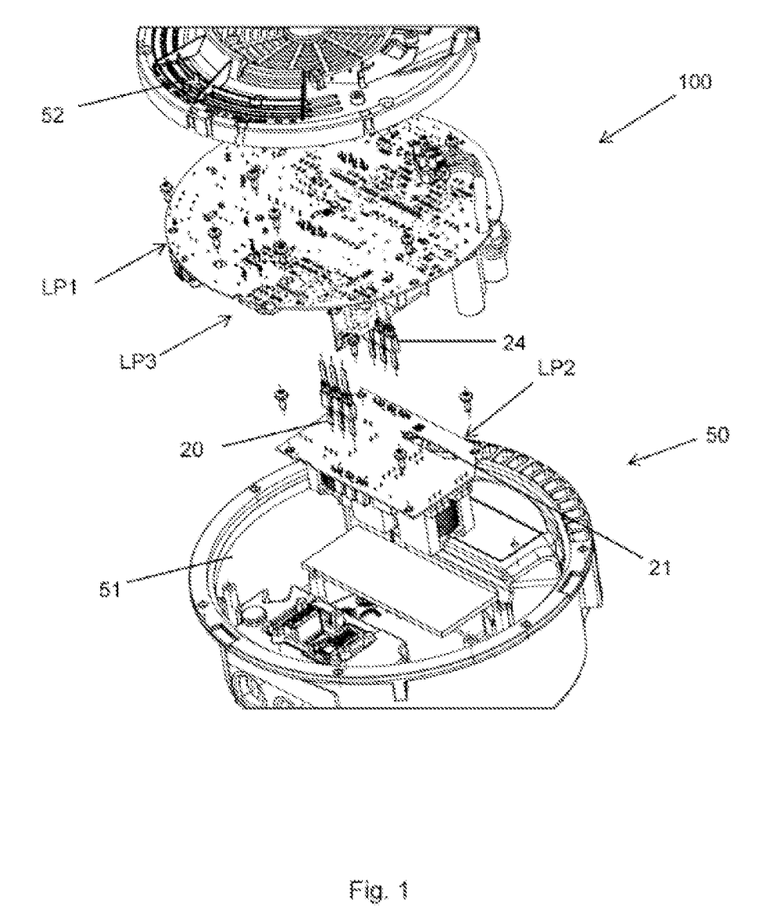
FIG. 1 is an exploded perspective view of three circuit boards (LP1, LP2, LP3) in superposition in a pre-assembly state together with a motor housing.

FIG. 1 shows a circuit board arrangement 100 that is composed of three superposed circuit boards LP1, LP2, LP3 in a pre-assembly state. These circuit boards LP1, LP2, LP3 are used to form a motor controller in a motor housing 50 between a housing pot 51 and a housing cover 52, designed as protection against contact. The circuit boards LP1, LP2, LP3 are all populated circuit boards. The second circuit board LP2 is designed with two rows of 3 contact elements 20 each. The contact elements 20 are used for plugging-together in the plug-in direction S to produce a detachable electrical connection with corresponding mating contacts 10 on the first circuit board LP1.

The first circuit board LP1 is the main board, the second circuit board LP2 is designed as a throttle board, and the third (standing) circuit board LP3 is the controller circuit board. It serves as a plate-shaped alignment and guidance device.

Figure 2:
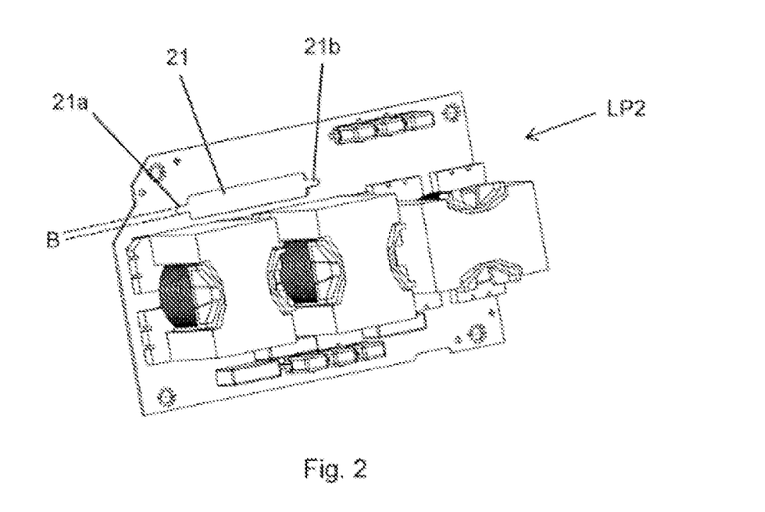
FIG. 2 is a perspective view of the second circuit board LP2 from the arrangement in FIG. 1.
Figure 3:
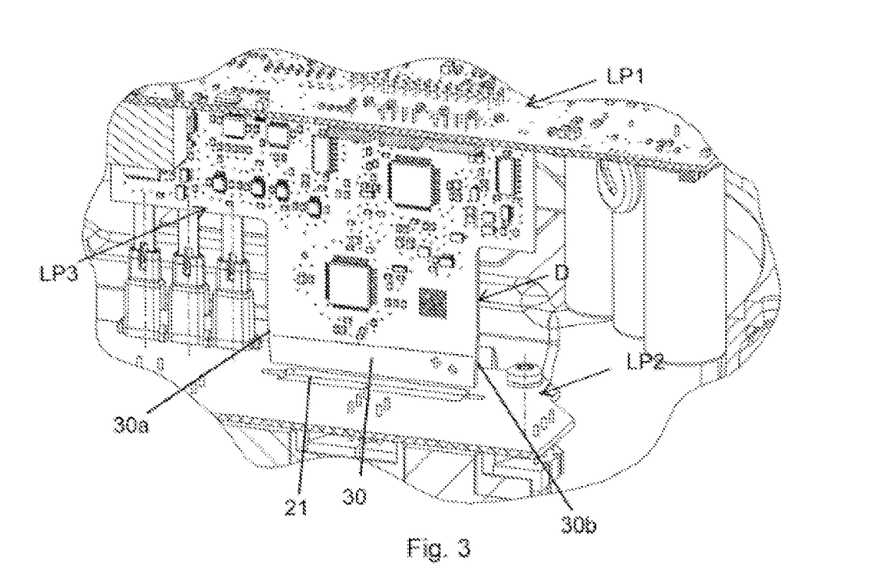
FIG. 3 is a detailed perspective view of the pre-assembly state when the first and second circuit boards are brought together, with the standing third circuit board acting as a guide.

The third circuit board LP3 protrudes, for this purpose, from the first circuit board LP1 in the plug-in direction S, as can be seen clearly in FIG. 3, toward the second circuit board LP2. At its free end, the third circuit board LP3 has an unpopulated circuit board portion, specifically an end-side portion 30. This is inserted into the gap 21 of the second circuit board LP2, shown underneath, and the circuit boards LP1 and LP2 are then plugged together. FIG. 2 clearly shows that the width B of the gap at the two opposite ends 21a, 21b of the gap 21 is smaller than the gap in the region therebetween and corresponds approximately to the thickness D of the third circuit board LP3.

Also visible are the two opposite side edges 30a, 30b of the third circuit board LP3. The edges run parallel in an upper region near the first circuit board LP1 and then do not run parallel to one another in the region of the end-side portion 30. At the end side portion, they run toward each other, so to speak, as an insertion bevel at an oblique angle to the plug-in direction S.

Figure 4:
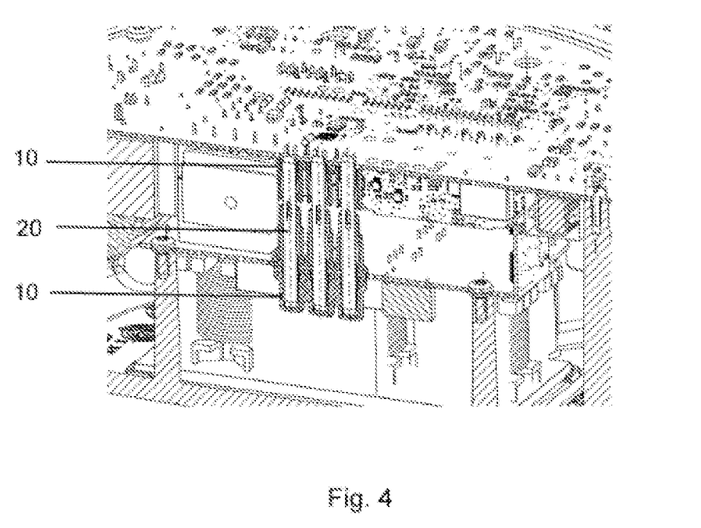
FIG. 4 is an enlarged detail of a sectional view showing three contacts.
Figure 5:
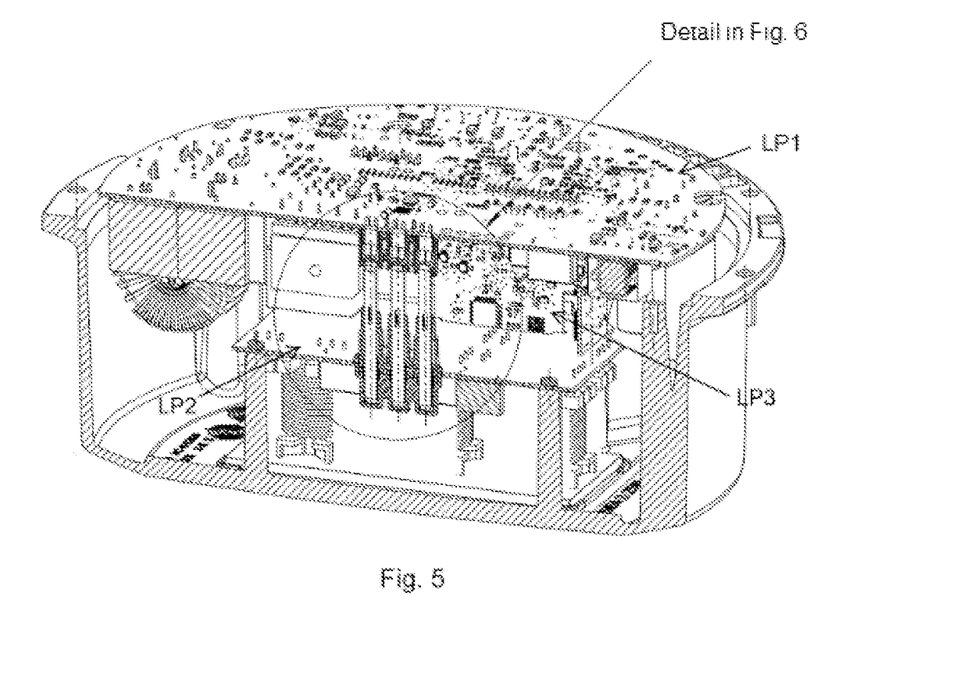
FIG. 5 is a perspective view partially in section through FIG. 1 in an assembly step.
Figure 6A:
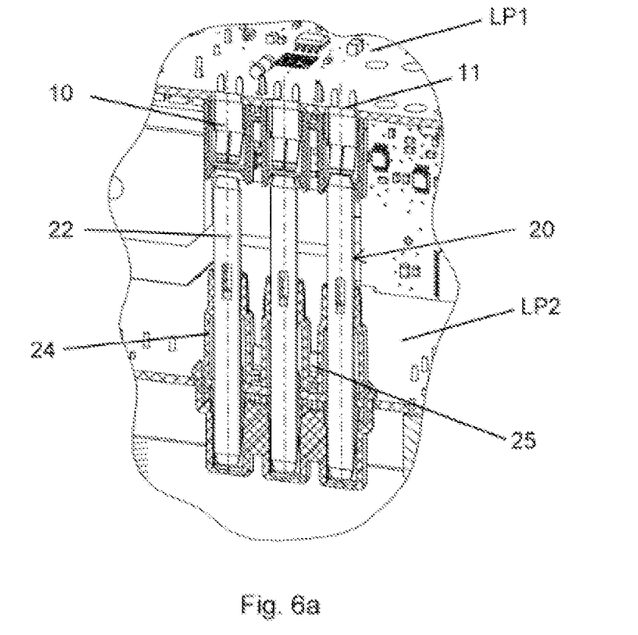
FIGS. 6a,b are enlarged section and perspective views of a detail from FIG. 5 in a different representation.
Figure 6B:
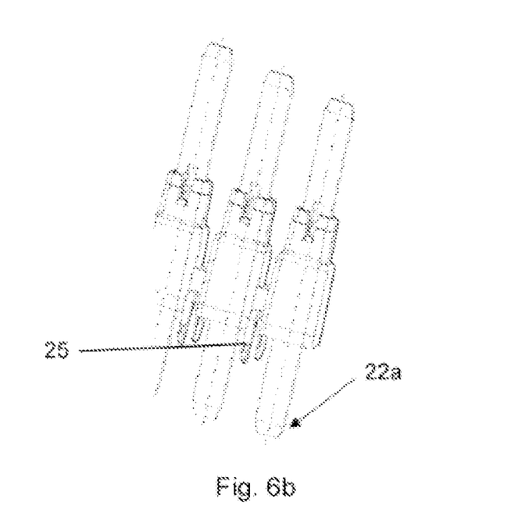
Figure 7:
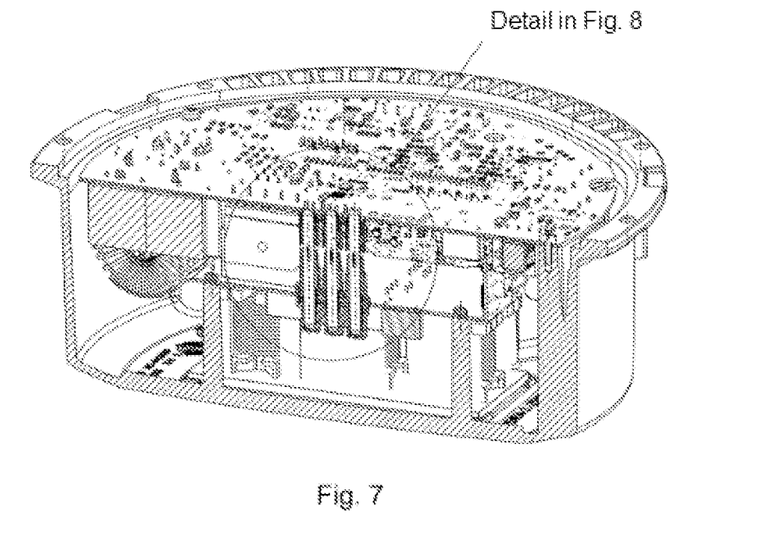
FIG. 7 is a perspective view partially in section of the arrangement from FIG. 1 in the final assembled state.
Figure 8:
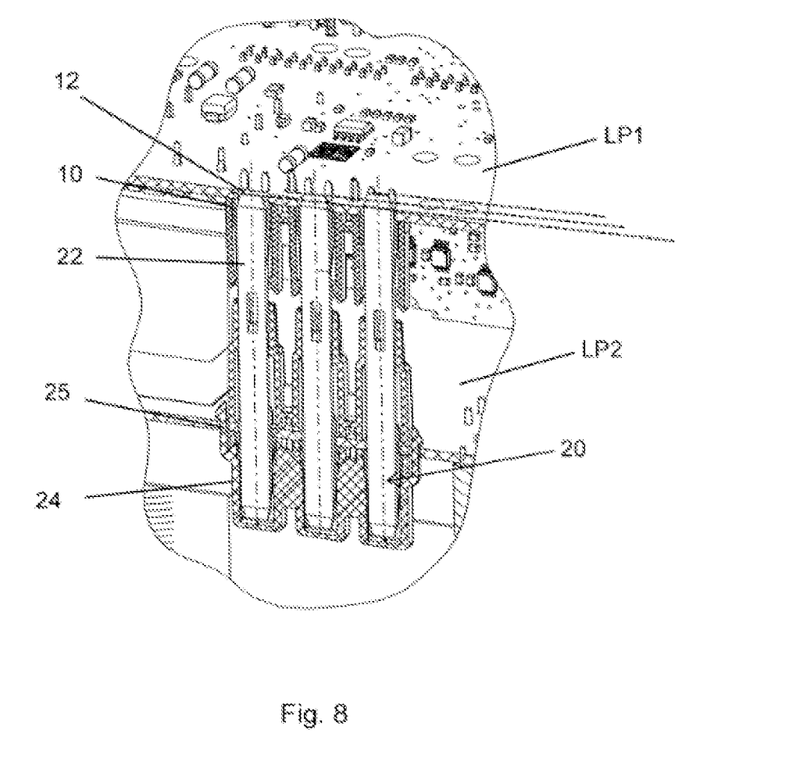
FIG. 8 is a cross-sectional view of a detail from FIG. 7.

FIG. 4 shows a detailed section in a sectional view when the circuit boards LP1, LP2 are plugged together. The one row of contacts, clearly visible and including the three contacts 20, are in electrical contacting engagement with the mating contacts 10, contact sockets 10, in the two circuit boards LP1 and LP2. FIGS. 5 and 6a, b show a state at the beginning of plugging-together of the circuit boards LP1, LP2. FIGS. 7 and 8 show them in the plugged-together assembled state.

In the first circuit board LP1, respective openings 11 are present in the circuit board LP1 in the region of the resilient socket contacts 10 through which the contact tongues 22 can pass. The three contacts 20 all protrude from the circuit board LP2 in a different length. The respective differences in length between the contacts 20 is provided as an equidistant difference in length ΔL (which the dashed lines attempt to illustrate). When they are plugged together, they successively engage one after the other and, in the final state, protrude to different extents through the circuit board LP1, namely through the openings 11 in the circuit board LP1, as can be seen clearly in the detail of FIG. 8.

The contacts 20 are embodied as blade contacts or as flat contacts over the entire length. Each contact 20 has two flat contact tongues 22 arranged at the ends, and are mounted in a contact carrier 24. The common contact carrier 24 has a locking member 25 by which the contact carrier 24 is attached to the circuit board LP2.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A circuit board arrangement for forming a motor controller in a motor housing comprising:
   at least one first populated circuit board and one second populated circuit including a plurality of contact elements designed to be plugged together in a plug-in direction in order to produce a detachable electrical connection with corresponding mating contacts of the first circuit board;
   a plate-shaped alignment and guidance device protrudes from the first circuit board in the plug-in direction toward the second circuit board;
   in an assembled state, the contact elements of the second circuit board are completely in the plugged-in state with the mating contacts of the first circuit board; and
   an end-side portion of the alignment and guidance device protrudes through a gap in the second circuit board, and the contact elements protrude from or out of the second circuit board in different lengths.

2. The circuit board arrangement as set forth in claim 1, wherein the plate-shaped alignment and guidance device is also a circuit board, particularly a populated circuit board.

3. The circuit board arrangement as set forth in claim 2, wherein the end-side portion of the circuit board is unpopulated.

4. The circuit board arrangement as claimed in claim 1, wherein a gap width of the gap in the second circuit board is defined such that the end-side portion of the alignment and guidance device is aligned and guided when the first and second circuit boards are plugged together, particularly such that a board thickness in the region of the end-side portion is only slightly smaller than the gap width.

5. The circuit board arrangement as set forth in claim 4, wherein the gap width in a region between two gap ends is larger, particularly 1.5 to 2.5 times as large as the gap in the guide region at the gap ends.

6. The circuit board arrangement as set forth in claim 1, wherein opposite side edges of the alignment and guidance device do not run parallel to one another in the region of the end-side portion, but rather preferably run toward each other as an insertion bevel at an oblique angle to the plug-in direction.

7. The circuit board arrangement as set forth in claim 1, wherein n contacts, where n>2, protrude from the second circuit board in different lengths, the differences in length between the contacts being selected such that those contacts having a length between the length of the shortest and longest contacts each differ by an equidistant difference in length $\Delta L$, so that when they are plugged together, the n contacts come into engagement successively one after the other.

8. The circuit board arrangement as set forth in claim 1, wherein the contacts are embodied as blade contacts or flat contacts, each with two flat contact tongues arranged at the ends and, when the first and second circuit boards (LP1, LP2) are plugged together, the contacts respectively dip with their one contact tongue into a socket contact on the respective first circuit board and contact the same electrically.

9. The circuit board arrangement as set forth in claim 1, further comprising a contact carrier arranged around the contacts including a locking member for mechanical attachment to one of the two circuit boards.

10. The circuit board arrangement as set forth in claim 1, wherein the first circuit board is a superordinate main circuit board of the motor controller.

11. The circuit board arrangement as set forth in claim 1, wherein the second circuit board is a throttle board having at least one throttle.

12. The circuit board arrangement as set forth in claim 2, wherein the third circuit board, electrically and mechanically connected to the first circuit board, is a motor controller.

13. The circuit board arrangement as set forth in claim 2, wherein the first and second circuit boards lie in parallel planes in the assembled state and the third circuit board or the plate-shaped alignment and guidance device is in a perpendicular plane.

14. An electronics housing for an electric motor having a circuit board arrangement as set forth in claim 1 in the housing between a housing pot and a housing cover.

15. A method for assembling a circuit board arrangement as set forth in claim 1, comprising the following steps:
  a. inserting the end-side portion of the plate-shaped alignment and guidance device protruding from and connected to the first circuit board, into the gap in the second circuit board and aligning the contacts of the second circuit board with the mating contacts of the first circuit board; and
  b. successive plugging-together the contacts with the mating contacts until all of the contacts are fully inserted.

* * * * *

UNITED STATES PATENT AND TRADEMARK OFFICE
CERTIFICATE OF CORRECTION

Page 1 of 1

PATENT NO. : 12,308,725 B2
APPLICATION NO. : 18/087884
DATED : May 20, 2025
INVENTOR(S) : Michael Sturm et al.

It is certified that error appears in the above-identified patent and that said Letters Patent is hereby corrected as shown below:

On the Title Page

<u>Column 2 (57) Abstract:</u>
Line 5 Delete "direction(S)" and insert --direction (S)--
Line 8 Delete "direction(S)" and insert --direction (S)--

Signed and Sealed this
Eighth Day of July, 2025

Coke Morgan Stewart
*Acting Director of the United States Patent and Trademark Office*